United States Patent [19]

Piascinski et al.

[11] 4,230,781

[45] Oct. 28, 1980

[54] METHOD FOR MAKING ETCH-RESISTANT STENCIL WITH DICHROMATE-SENSITIZED ALKALI-CASEINATE COATING

[75] Inventors: Joseph J. Piascinski, Leola; Ernest E. Doerschuk, III, East Petersburg, both of Pa.

[73] Assignee: RCA Corporation, New York, N.Y.

[21] Appl. No.: 659,269

[22] Filed: Feb. 19, 1976

Related U.S. Application Data

[63] Continuation-in-part of Ser. No. 505,511, Sep. 12, 1974, abandoned.

[51] Int. Cl.² ............................................. G03C 5/00
[52] U.S. Cl. ............................................ 430/5; 156/634; 156/644; 156/659.1; 430/23; 430/270; 430/274; 430/320; 430/323
[58] Field of Search ............... 96/36, 36.1, 93, 114.9, 96/88, 35.1; 156/13, 634, 644, 659, 673; 355/85; 430/5, 23, 270, 274, 320

[56] References Cited

U.S. PATENT DOCUMENTS

| | | | |
|---|---|---|---|
| 2,387,056 | 10/1945 | Buck et al. | 96/93 |
| 2,624,672 | 1/1953 | Frost et al. | 96/93 |
| 2,677,611 | 5/1954 | Gregory et al. | 96/93 |
| 2,716,061 | 8/1955 | Lupo | 96/93 |
| 3,745,011 | 7/1973 | Hudgin | 96/88 |
| 3,751,250 | 8/1973 | Moscony et al. | 96/36 |

OTHER PUBLICATIONS

"The Merck Index of Chemicals and Drugs", 1952, p. 207.

Primary Examiner—Edward C. Kimlin
Attorney, Agent, or Firm—E. M. Whitacre; G. H. Bruestle; L. Greenspan

[57] ABSTRACT

Method comprises applying to a surface to be etched a coating of a liquid composition having a pH of about 5.8 to 7.0 and comprising an alkali caseinate, an alkali dichromate photosensitizer, sodium borate and water. The layer is dried, photoexposed, developed and baked to produce an etch-resistant stencil.

10 Claims, 6 Drawing Figures

METHOD FOR MAKING ETCH-RESISTANT STENCIL WITH DICHROMATE-SENSITIZED ALKALI-CASEINATE COATING

CROSS-REFERENCE TO RELATED APPLICATION

This is a continuation-in-part of patent application Ser. No. 505,511 filed Sept. 12, 1974 having the same applicants and assignee hereof, and now abandoned.

BACKGROUND OF THE DISCLOSURE

This invention relates to a method for making an etch-resistant stencil on a metal work piece, particularly a metal sheet. The novel method may be used, for example, in a method for etching an apertured mask for use in a color television picture tube.

The preparation of apertured masks by photoexposure and etching has been described previously; for example, in U.S. Pat. Nos. 2,750,524 to F. G. Braham, 3,199,430 to S. A. Brown, 3,313,225 to N. B. Mears, and 3,751,250 to J. J. Moscony et al. In a typical process, a thin metal sheet, such as of a cold-rolled steel or a copper-nickel alloy, is coated on both major surfaces thereof with a light-sensitive resist or enamel. The coatings are exposed to light images as by contact-printing exposure to render the exposed portions thereof less soluble in a particular solvent. The exposed coatings are developed to remove the more-soluble unexposed portions thereof, and then baked to render the retained, less-soluble, exposed portions etch resistant. Then, the sheet with the etch-resistant stencil thereon is selectively etched as desired, after which the stencils are removed from the sheet.

In prior methods, the light-sensitive resist is usually comprised of fish glue and an alkali-dichromate photosensitizer therefor. The resist is applied from an aqueous coating composition to the metal surface and then dried. In some prior methods, casein has been substituted for fish glue. Where casein has been substituted, the liquid coating composition has a pH of more than 7.0, usually about 9.0 to 10.0, in order to render the casein sufficiently soluble to deposit an adequate amount of material to produce an etch-resistant stencil. Such high pH values reduce the photosensitivity of the resist and therefore require excessively long exposures for producing the stencil.

SUMMARY OF THE INVENTION

In the novel method, the surface of the article to be etched is coated with a liquid coating composition comprised of an alkali caseinate, preferably sodium caseinate, an alkali dichromate, sodium borate and water. The coating composition has a pH in the range of about 5.8 to 7.0, preferably between 6.5 and 6.9. The coating is then dried, photoexposed, developed and baked to produce an etch-resistant coating on the surface of the article.

A dichromate-sensitized alkali caseinate layer produced from a liquid composition having a pH in the range of 5.8 to 7.0 exhibits higher photosensitivity and requires relatively short exposure times. The coating composition includes sodium borate (borax) to improve the developing properties and sensitivity of the dry coating. The exposed layers may be developed with normal techniques to produce stencils with relatively high resolution. After the article is etched, the baked stencil may be removed easily with a caustic solution with little or no residue remaining.

DETAILED DESCRIPTION OF THE PREFERRED EMBODIMENT

Figure 1:
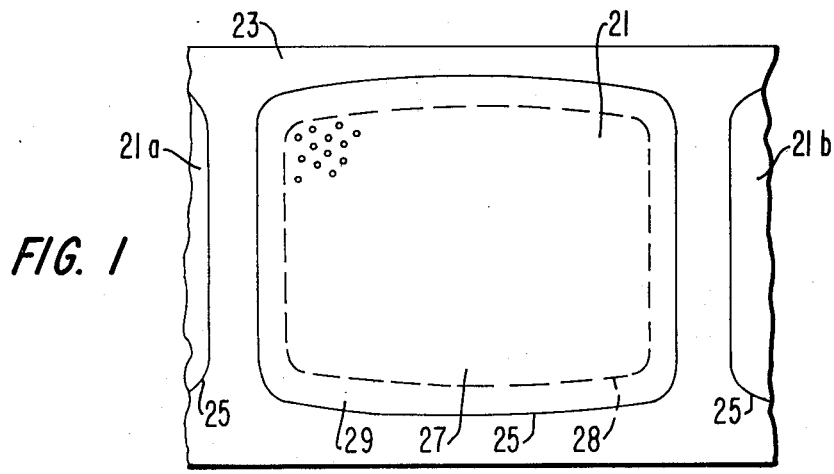
FIG. 1 is a plan view of a metal sheet after etching according to the novel method.

FIG. 1 shows a plan view of an etched apertured mask blank 21 as it emerges from the etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank 21 in place in the sheet 23. The mask blank 21 is comprised of an apertured central portion 27 defined by the broken line 28; and a skirt or peripheral portion 29 which is not apertured, although in some embodiments it may be etched partly through. This application is particularly concerned with the etch-resistant stencil used for etching the apertures in the apertured central portion 27. The apertures may be round and arranged in a hexagonal, diamond-shaped or other array. Or, the apertures may be rectangular slits arranged in vertical rows; for example, 6-mil by 30-mil slits on 30-mil centers. The apertures may be of other shapes and arrangements. In any of the embodiments, the aperture width may be uniform across the mask or may be graded in width or diameter from the center to the edge of the array as is known in the art.

The mask blank 21 is etched into a regular-carbon or a low-carbon cold-rolled-steel sheet about 4 to 10 mils in thickness. The etching may also be conducted in sheets of other materials, such as invar alloy, or a copper-nickel alloy. The sheet 23 is passed through the various operations including cleaning the sheet, producing etch-resistant stencils on the sheet, etching the sheet to produce the apertures and to define the mask blanks, and then stripping the stencils from the sheet. Subsequently, the mask blanks 21 are torn from the sheet 23. The mask blanks 21 are then heat treated (annealed), roller leveled, formed on a press, and then blackened as is known in the art, to produce masks suitable for assembly into a color-television picture tube.

Figure 2:
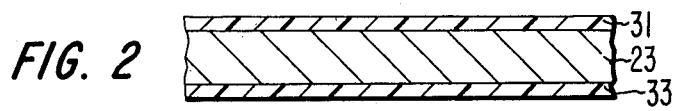
FIGS. 2 through 6 are sectional views through one aperture of a metal sheet illustrating the steps of one embodiment of the novel method.
Figure 3:
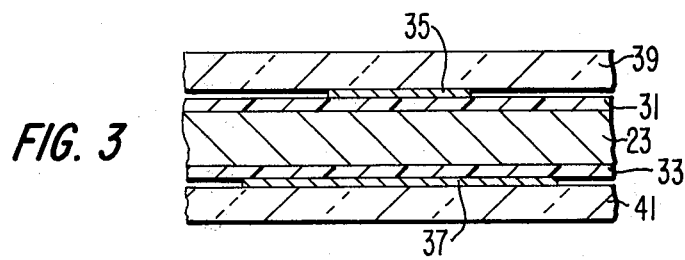

FIGS. 2 through 6 show a sequence of steps that may be used in making a round aperture in the central portion 27 of a hexagonal array of apertures in a 6-mil-thick strip of low-carbon cold-rolled steel, as shown in FIG. 1. The sheet 23 is coated on both major surfaces with one of the novel coating compositions set forth below. The coatings are dried in air producing light-sensitive coatings 31 and 33 of dichromate-sensitized sodium caseinate, as shown in FIG. 2. After the coatings have dried, the coated strip is positioned in a chase, such as is shown in U.S. Pat. No. 3,751,250 to J. J. Moscony et al, between two light-opaque master patterns; one master pattern 35 for the coating 31 on the one major surface of the sheet 23; and the other master pattern 37 for the other coating 23 on the other major surface of the sheet 23, as shown in FIG. 3. The light-opaque patterns may be of chromium or nickel metal coated on the inner surfaces of glass plates 39 and 41 respectively so that the patterns physically contact the coatings 31 and 33. The one master pattern 35 has a circular shape about 5 mils in outside diameter. The other master pattern 37 has a circular shape about 16 mils in diameter. Center lines of the one and the other master patterns are coincident, but may be offset from one another if desired.

As shown in FIG. 3, the coatings 31 and 33 on the one and the other surfaces of the sheet 23 are now exposed to hardening radiation (shown by the arrows above and below the glass plates 39 and 41), as from a carbon-arc source, which radiation passes through the glass plates 39 and 41 incident on the coatings 31 and 33. The radiation insolubilizes the coatings 31 and 33 except where the one and the other master patterns 35 and 37 shadow the coatings. When the coatings are suitably exposed, the exposure is stopped, and the master patterns removed.

Figure 4:
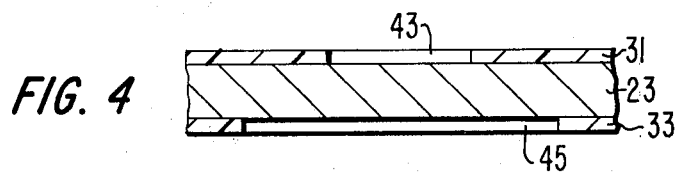

The coatings are now developed as by flushing with water or other aqueous solvent to remove the unexposed, more-soluble, shadowed portions of the coatings 31 and 33. As shown in FIG. 4, after development, the sheet 23 carries on its one surface a stencil comprising a coating 31 having a first circular opening 43 therein and, on its other major surface, a stencil comprising a coating 33 having a second circular opening 45 therein. The stencil coatings 31 and 33 with the openings 43 and 45 therein are now baked in air at about 260° to 325° C. to develop better etch resistance in the coatings.

Figure 5:
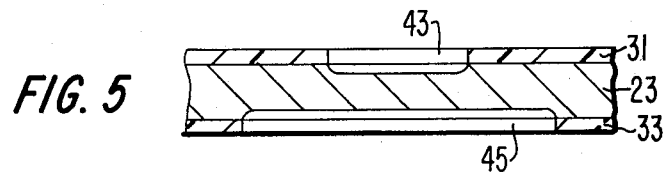
Figure 6:
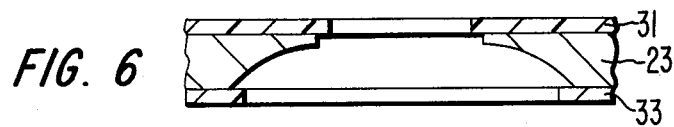

The sheet 23 with the etch-resistant coatings thereon is now etched from both sides thereof in a single step to produce the desired aperture. FIGS. 5 and 6 show the stencil-coated sheet 23 at an early stage (FIG. 5) when the etchant has dissolved a small amount of the surfaces of the sheet 23 in the uncoated areas thereof, and then at the end of etching (FIG. 6). The etching is conducted in the usual manner employing a ferric-chloride hydrochloric-acid liquid etchant. Controlled amounts of chlorine gas are fed into the etchant to maintain its etching strength.

After the etching has been completed, the coated sheet 23 is washed with water to remove any residual etchant. Then, the etch-resistant coatings 31 and 33 on the one and the other surfaces of the sheet 23 are removed from the strip, as by spraying thereon an aqueous solution of sodium hydroxide maintained at temperatures of about 50° to 80° C. After removing the stencil coatings, the sheet is washed in water and dried.

The following compositions in grams may be used in the foregoing method. Composition #1 is for a laboratory-sized batch, and composition #2 is for a pilot-manufacturing-sized batch. The properties given are for a freshly-mixed batch just prior to coating.

| Coating Compositions | #1 | #2 | #3 | #4 |
| --- | --- | --- | --- | --- |
| Sodium Caseinate | 110.0 | 4,157 | 3,782 | 3,782 |
| Borax | 12.0 | 441 | 719 | 1,134 |
| Ammonium Dichromate | 11.0 | 1,030 | 832 | 1,134 |
| Dispersing Agent | 0.15 | 6 | 6.7 | 6.7 |
| Bactericide | 5.0 | 123 | 0 | 0 |
| Water | | to desired specific gravity | | |
| Viscosity cps @ 21.1° C. | 11.5 | 7.5 | 9.5 | 8.5 |
| Specific Gravity @ 21.1° C. | 1.032 | 1.030 | 1.030 | 1.034 |
| pH | 6.6 | 6.8 | 6.8 | 6.9 |

| Coating Compositions | #1 | #2 | #3 | #4 |
| --- | --- | --- | --- | --- |
| Weight Ratio Borax/Caseinate | 0.11 | 0.11 | 0.19 | 0.30 |

Mixing Composition #1

1. Dissolve the sodium caseinate in 800 ml. water at about 120° F. (49° C.) with rapid, high-shear stirring. One suitable sodium caseinate is Ultra Supreme sodium caseinate, code 03 grade, marketed by Erie Casein Co., Erie, Ill.
2. Add the dispersing agent, such as Triton DF-18, to the sodium caseinate solution.
3. Dissolve the borax (hydrated sodium borate or $Na_2B_4O_7.10H_2O$) in 100 ml. deionized water and heat the solution to about 90° C. (194° F.). Slowly add the hot borax solution to the sodium caseinate solution.
4. Dissolve the bactericide, such as phenol, in 100 ml. deionized water, and add this mixture to the sodium caseinate solution. Cool this concentrate to about 20° to 23° C.
5. Dissolve the ammonium dichromate $(NH_4)_2Cr_2O_7$ in 200 grams deionized water. Add this dichromate solution to the sodium caseinate solution.

Mixing Composition #2

1. Dissolve the borax in 4 liters of hot (about 80° C.) deionized water. Add this borax solution to 32 liters of hot (about 80° C.) deionized water.
2. Add the dispersing agent, such as Sulframin 4010, to the solution, and apply high-shear stirring to the solution for about two minutes.
3. Add the sodium caseinate to the borax solution with high shear stirring applied to form the sodium caseinate concentrate.
4. Add the bactericide to the sodium caseinate concentrate.
5. Cool the concentrate to about 20° to 23° C., and then add thereto a solution of the ammonium dichromate dissolved in 5 liters deionized water with stirring at slow speed.
6. Add deionized water to the concentrate to provide the desired specific gravity.

Mixing Composition #3

1. Dissolve the borax in 33.5 liters of hot (55° to 85° C.) water with high-shear stirring.
2. Add the sodium caseinate slowly to the borax solution. If lumps form, do not add additional sodium caseinate until the initial material is dissolved. Continue mixing until all of the sodium caseinate is completely dissolved. Then, continue the mixing until the temperature of the solution is 25°±2° C.
3. In a separate container, dissolve the ammonium dichromate in about 4.1 liters of deionized water at room temperature (20° C.). Add this ammonium dichromate solution to the sodium-caseinate-borax solution and stir the combined mixture for about 5 minutes.
4. In a separate container dissolve the dispersing agent, such as Sulframin 4010D, in about 0.5 liter of deionized water, and then add that solution to the mixture from step 3.

5. Then, add sufficient water to provide the desired specific gravity.

Mixing Composition #4

Follow the procedure outlined above for mixing composition #3. Composition #4 has a higher concentration of borax, which would increase the pH of the coating composition. This increase is compensated for by the higher concentration of ammonium dichromate, which forms acid solutions.

GENERAL CONSIDERATIONS

Information obtained from the literature and vendors is that raw casein may be solubilized by the addition of an alkali, such as sodium hydroxide, ammonium hydroxide and other basic materials. Our early work in developing a raw casein etch-resistant coating employed coating compositions having a strongly basic pH of about 11.1. Sodium hydroxide was used to adjust the pH and to solubilize the casein. Steel strips that were coated with stencils made from these high-pH coating compositions contained about 10% ammonium drichromate. After drying, the coatings were exposed for about 10 minutes and then developed. These coatings printed latent images, but the coatings washed off during developing in 100° F. (37.8° C.) water.

The poor photosensitivity was traced to the conversion of dichromate anions to chromate ions due to the high pH. The chromate anion is not as sensitive to ultraviolet light as is the dichromate anion. When the pH of the coating composition is in the 5.8 to 7.0 range, the exposure times are compatible with production requirements, and the coating does not wash off with normal exposures.

Numerous 2"×2" samples of steel strips were coated with various low-pH casein-coating compositions, and were dried, exposed, developed, baked and etched. The etched samples were not of good quality because the "tanning" of the stencil was not well defined. Fish-glue-stencil samples were used as a control and for comparison. Often, the developing was incomplete, as exhibited by a lack of etching on the sample strips. The developing could be improved slightly by the use of hotter water up to about 180° F. (82.2° C.), but the stencils and etched samples were still unsatisfactory.

Samples of sodium caseinate, ammonium caseinate, potassium caseinate and French-grade casein were prepared as 10% solutions, placed in clear-glass bottles, and a visual judgment was made of their respective opacities. The pH of an aqueous sodium caseinate solution is about 6.3. The sodium caseinate solutions were much "clearer" than any of the other solutions, indicating better solubilization. Potassium and ammonium caseinate solutions were next clearest, and the casein solutions were the least clear.

Two strips of mask steel, 10 feet long, were coated and dried with a coating composition prepared with French-grade casein and sodium caseinate. Both coated steel strips were processed as described above. The French-casein formulation did not "tan" well at printing and produced prints that were not well defined. The sodium-caseinate formulation, however, "tanned" well and produced well-defined prints. In developing with 100° F. (37.8° C.) water, the sodium-caseinate sample etched well, but the French-casein sample did not etch satisfactorily. In addition, etch-resistant stencils made with the French-grade casein were not satisfactorily removed in the caustic bath after etching, while the stencils made with sodium-caseinate compositions were removed easily.

In the coating composition, several factors are important:

1. Any alkali caseinate may be used. Sodium caseinate is preferred over potassium caseinate and ammonium caseinate because of its greater solubility in water and because of other characteristics. Alkali caseinates, because of their greater solubility, can be exposed, developed and etched satisfactorily, while caseins, including caseins that are solubilized with alkali, cannot. It is preferred that the alkali caseinate have a high molecular weight, preferably above 250,000, in order to realize maximum photosensitivity in the dry coating. Generally, the alkali caseinate comprises about 4 to 12 weight percent of the coating composition.

2. The pH of the coating composition must fall between 5.8 and 7.0, preferably between 6.5 and 6.9. The pH may not be lower than 5.8 or higher than 7.0, or the sensitivity of the coating will be inadequate. Specific gravity of the coating composition determines in part the thickness of the coating. The lower the specific gravity, the thinner the coating. Also, the higher the temperature in the coating chamber, the thinner the coating produced. Specific gravities of 1.028 to 1.036 produce suitable coatings between about 40 and 200 microinches thick.

3. Among sodium, potassium, and ammonium dichromate sensitizers, ammonium dichromate is preferred because it imparts greater sensitivity to the coatings. Also, ammonium dichromate has less of a tendency to crystallize out during the drying step than the sodium and potassium dichromates. The exposure times of ammonium-dichromate-sensitized alkali-caseinate coatings are equivalent to that of ammonium-dichromate-sensitized fish-glue coatings. The sensitizer comprises about 5 to 30 weight percent of the alkali caseinate present.

4. The dispersing agent, which aids in producing the coating composition, may be selected from a large group of available dispersing agents. Some suitable dispersing agents are Triton DF-18 marketed by Rohm and Haas, Philadelphia, Pa., and Sulframin 4010 marketed by Witco Chemical Co., New York, N.Y. The bactericide may be omitted if the coating composition is used within three days of the mixing of the alkali caseinate. Some suitable bactericides are phenol and Dowicide G-ST marketed by Dow Chemical Co., Midland, Mich.

5. If, after the application of the coating composition, the temperature of the drying tunnel falls below 100° F. (37.8° C.), "specks" of ammonium dichromate may appear, causing serious mask-scrap problems. A drying tunnel temperature of about 125° C. (51.7° F.) to 160° F. (71.1° C.) is recommended. The drying oven should provide a temperature of about 90° C. (194° F.) at the top and bottom of the sensitized strip exiting the oven, as measured with a surface pyrometer.

6. The presence of borax (sodium borate decahydrate) in the coating permits faster and more satisfactory processing. When borax is omitted, the alkali caseinate coating may be poorly developed. To overcome this problem, slower line speeds and higher developing temperatures may be necessary. This causes slower production rates. The optimum developing temperature is 100° F. (37.8° C.). The borax comprises about 0.10 to 0.35, and preferably 0.18 to 0.30, of the weight of the alkali caseinate present in the coating composition. Above 0.30 (30%), the viscosity of the coating composition is disturbed and is not easily controlled, which makes difficult the control of the dry coating thickness. Above 0.35, the pH of the coating composition is above 7.0 and cannot be lowered without the addition of more alkali dichromate or some acid. Also, above 0.35, the filtering action of light by the dichromate in the dry layer is increased, thereby lengthening the required exposure time to impractical values. Where higher concentrations of alkali dichromate are used to lower the pH of the coating composition, recrystallization of some dichromate on the metal can take place as the coating dries causing "specks" as mentioned above. Below 0.18 (18%), spurious deposits of nodules high in iron and/or chromium may form on the metal surface, which nodules interfere with both the photoexposure and etching steps.

7. Coating thicknesses on the metal sheet are an important parameter in mask manufacturing. If the resist is too thin, under 40 microinches, the etching will be nonuniform and cause mask defects. If the resist is too thick, over 200 microinches, the result will be longer exposure times, mechanical problems of abrasion sticking, pumpdown problems and poor mask uniformity. Typical thickness values of a coating containing sodium caseinate compared to one containing fish glue made from coating compositions having the same specific gravity (1.032) at 24° C. (75° F.) are:

|  | Sodium Caseinate | Fish Glue |
| --- | --- | --- |
| Top | 40 to 70 microinches | 40 microinches |
| 8" down | 80 to 100 microinches | 70 microinches |
| 16" down | 100 to 190 microinches | 120 microinches |

8. The preferred bake-in temperature for imparting etch resistance to a developed sodium caseinate coating must be in the range of 260° C. to 325° C. Sodium-caseinate coatings baked at lower temperatures are most efficiently removed in the caustic wash after etching. Generally, the higher the temperature of the etchant used, the higher should be the baking temperature for the developed coating.

We claim:

1. A method for producing an etch-resistant stencil upon a surface comprising applying to said surface a coating of a liquid composition having a pH of about 5.8 to 7.0 and comprising
    (i) an alkali caseinate,
    (ii) an alkali dichromate photosensitizer for said caseinate
    (iii) hydrated sodium borate, the weight of said hydrated sodium borate comprising 0.10 to 0.35 of the weight of said alkali caseinate, and
    (iv) water,
drying said coating, photoexposing said coating to a light image, developing said exposed coating to produce said stencil, and then baking said stencil in air to render said pattern etch resistant.

2. The method defined in claim 1 wherein the weight of said sodium borate comprises 0.18 to 0.30 of the weight of said alkali caseinate.

3. The method defined in claim 1 wherein said composition has a pH in the range of 6.5 to 6.9.

4. The method defined in claim 1 wherein said dry coating before baking is about 40 to 100 microinches thick.

5. The method defined in claim 1 wherein said alkali caseinate is sodium caseinate and said alkali dichromate is ammonium dichromate.

6. In a method for producing an apertured mask for a cathode-ray tube, the steps comprising
    (a) applying to each major surface of a metal sheet a coating of a liquid, water-based coating composition having a pH of about 5.8 to 7.0 and consisting essentially of
        (i) alkali caseinate,
        (ii) an alkali dichromate photosensitizer for said caseinate,
        (iii) hydrated sodium borate, the weight of said hydrated sodium borate comprising 0.10 to 0.35 of the weight of said alkali caseinate, and
        (iv) water,
    (b) drying said coatings,
    (c) exposing said dry coatings to light images,
    (d) developing said exposed coatings to produce stencils on each of said major surfaces,
    (e) baking said stencils in air to render said stencils etch resistant,
    (f) and then applying an etchant for said metal sheet to both of said major surfaces until said sheet is etched a desired amount.

7. The method defined in claim 6 wherein the specific gravity of said coating composition is in the range 1.028 to 1.036.

8. The method defined in claim 6 wherein said pH is in the range of 6.5 to 6.9.

9. The method defined in claim 8 wherein said pattern is baked in air at about 260° to 325° C.

10. The method defined in claim 8 wherein said sheet is of cold-rolled steel and said etchant includes ferric chloride.

* * * * *